(12) United States Patent
Hsieh

(10) Patent No.: US 8,648,413 B2
(45) Date of Patent: Feb. 11, 2014

(54) SUPER-JUNCTION TRENCH MOSFET WITH MULTIPLE TRENCHED SOURCE-BODY CONTACTS

(75) Inventor: Fu-Yuan Hsieh, New Taipei (TW)

(73) Assignee: Force MOS Technology Co., Ltd., New Taipei (TW)

(*) Notice: Subject to any disclaimer, the term of this patent is extended or adjusted under 35 U.S.C. 154(b) by 55 days.

(21) Appl. No.: 13/433,664

(22) Filed: Mar. 29, 2012

(65) Prior Publication Data

US 2012/0187477 A1  Jul. 26, 2012

Related U.S. Application Data

(63) Continuation-in-part of application No. 13/303,474, filed on Nov. 23, 2011, now Pat. No. 8,373,225, which is a continuation-in-part of application No. 12/654,637, filed on Dec. 28, 2009, now Pat. No. 8,067,800.

(51) Int. Cl.
  *H01L 29/78* (2006.01)

(52) U.S. Cl.
  USPC .................................. 257/331; 257/E29.262

(58) Field of Classification Search
  USPC ........................................... 257/331, E29.262
  See application file for complete search history.

(56) References Cited

U.S. PATENT DOCUMENTS 8,373,225 B2 * 2/2013 Hsieh ........................... 257/331

* cited by examiner

*Primary Examiner* — Matthew W Such
*Assistant Examiner* — Monica D Harrison
(74) *Attorney, Agent, or Firm* — Bacon & Thomas, PLLC

(57) ABSTRACT

A super-junction trench MOSFET with split gate electrodes is disclosed for high voltage device by applying multiple trenched source-body contacts with narrow CDs in unit cell. Furthermore, source regions are only formed along channel regions near the gate trenches, not between adjacent trenched source-body contacts for UIS (Unclamped Inductance Switching) current enhancement.

14 Claims, 19 Drawing Sheets

US 8,648,413 B2

SUPER-JUNCTION TRENCH MOSFET WITH MULTIPLE TRENCHED SOURCE-BODY CONTACTS

CROSS-REFERENCE TO RELATED APPLICATION

This application is a Continuation-In-Part of U.S. patent application Ser. No. 13/303,474 of the same inventor, filed on Nov. 23, 2011 now U.S. Pat. No. 8,373,255 entitled "Super-Junction Trench MOSFET with RESURF stepped oxides and split gate electrodes", which is a Continuation-In-Part of U.S. patent application Ser. No. 12/654,637 filed Dec. 28, 2009, now U.S. Pat. No. 8,067,800 of the same inventor.

FIELD OF THE INVENTION

This invention relates generally to the cell structure, device configuration and fabrication process of power semiconductor devices. More particularly, this invention relates to a novel and improved cell structure, device configuration and improved fabrication process of a super-junction trench MOSFET (Metal Oxide Semiconductor Field Effect Transistor) with multiple trenched source-body contacts.

BACKGROUND OF THE INVENTION

Compared to the conventional trench MOSFETs, super-junction trench MOSFETs are more attractive due to higher breakdown voltage and lower specific Rds (drain-source resistance). As is known to all, a super-junction trench MOSFET is implemented by a p type column structure and an n type column structure arranged in parallel and connecting to each other onto a heavily doped substrate, however, the manufacturing yield is not stable because the super-junction trench MOSFET is very sensitive to the fabrication processes and conditions such as: the p type column structure and the n type column structure dopant re-diffusion issue induced by subsequent thermal processes; trapped charges within the column structure, etc..... All that will cause a hazardous condition of charges imbalance to the super-junction trench MOSFET. More specifically, these undesired influences become more pronounced with a narrower column structure width for a lower bias voltage ranging under 200V.

Prior art (paper "Industrialization of Resurf stepped oxide technology for Power Transistor", by M. A. Gajda, etc., and paper "Tunable Oxide-Bypassed Trench Gate MOSFET Breaking the Ideal Super-junction MOSFET Performance Line at Equal Column Width", by Xin Yant, etc.) disclosed device structures in order to resolve the limitation caused by the conventional super-junction trench MOSFET discussed above, as shown in FIG. 1A and FIG. 1B. Except some different terminologies (the device structure in FIG. 1A named with RSO: Resurf Stepped Oxide and the device structure in FIG. 1B named with TOB: Tuable Oxide-Bypassed). Both the device structures in FIG. 1A and FIG. 1B are basically the same which can achieve a lower specific Rds and a higher breakdown voltage than a conventional super-junction trench MOSFET because each the epitaxial layer formed in FIG. 1A and FIG. 1B has a higher doping concentration than the conventional super-junction trench MOSFET.

Refer to FIG. 1A and FIG. 1B again, both the device structures have a deep trench with a thick oxide layer along trench sidewalls and bottoms into a drift region. Only difference is that, the device structure in FIG. 1A has a single epitaxial layer (N Epi, as illustrated in FIG. 1A) while the device structure in FIG. 1B has double epitaxial layers (Epi1 and Epi2, as illustrated in FIG. 1B, the Epi1 supported on a heavily doped substrate has a lower doping concentration than the Epi2 near a channel region.) Due to the p type column structure and the n type column structure inter-diffusion, both the device structures in FIG. 1A and FIG. 1B do not have charges imbalance issue, resolving the technical limitation caused by the conventional super-junction trench MOSFET, however, the benefit of both the device structures in FIG. 1A and FIG. 1B over the conventional super-junction trench MOSFET only pronounces at the bias voltage ranging under 200V, which means that, the conventional super-junction trench MOSFET has a lower Rds when the bias voltage is beyond 200V.

U.S. Pat. No. 7,601,597 disclosed a method to avoid the aforementioned p type column structure and the n type structure dopant re-diffusion issue, for example in an N-channel trench MOSFET as shown in FIG. 1C, by setting up the p type column formation process at a last step after all diffusion processes such as: sacrificial oxidation after trench etch, gate oxidation, P body region formation and n+ source region formation, etc. ... have been finished.

However, the disclosed method of this prior art is not effective because that, firstly, the p type column structure is formed by growing an additional p type epitaxial layer in deep trenches etched in an n type epitaxial layer; secondly, an additional CMP (Chemical Mechanical Polishing) is required for surface planarization after the p type epitaxial layer is grown; thirdly, double trench etches are necessary (one for shallow trenches for trenched gates formation and another for the deep trenches for the p type column structure formation), all the increased cost is not conductive to mass production. Moreover, other factors such as: the charges imbalance caused by the trapped charges within the column structure is still not resolved.

Therefore, there is still a need in the art of the semiconductor power device, particularly for super-junction trench MOSFET design and fabrication, to provide a novel cell structure, device configuration that would resolve these difficulties and design limitations.

SUMMARY OF THE INVENTION

The present invention provides a super-junction trench MOSFET with resurf stepped oxides (RSO) having additional freedom for better performance optimization and manufacturing capability by tuning a thick oxide thickness to minimize influence of the charges imbalance, trapped charges, etc. Therefore, the present invention only requires one kind gate trenches and a single epitaxial layer to achieve a better cost effective than the prior arts. Moreover, the present invention also provides multiple trenched source-body contacts in a mesa between two adjacent gate trenches in an active area because that, for middle voltage device (100~200V) with narrow mesa, a single trenched source-body contact with a narrow contact CD (Critical Dimension) disposed in unit cell is enough for source-body contact, however, for high voltage device (above 200V) with wide mesa, multiple trenched source-body contacts with narrow contact CDs are required. According to the present invention, the multiple trenched source-body contacts are formed in unit cell and filled with tungsten plugs for wide mesa, furthermore, source regions are only formed along channel regions near the gate trenches, not between adjacent trenched source-body contacts for UIS (Unclamped Inductance Switching) current enhancement.

In one aspect, the present invention features a super-junction trench MOSFET comprising: a substrate of a first conductivity type; an epitaxial layer of the first conductivity type onto the substrate, wherein the epitaxial layer has a lower doping concentration than the substrate; a plurality of gate trenches starting from a top surface of the epitaxial layer and extending downward into the epitaxial layer, each of the gate trenches being padded by a first gate insulation layer along a lower inner surface and padded by a second gate insulation layer along an upper inner surface, wherein the first gate insulation layer has a greater thickness than the second gate insulation layer; a plurality of mesas between two adjacent gate trenches; a plurality of first doped column regions of a second conductivity type formed in the mesas; a plurality of second doped column regions of the first conductivity type formed in the mesas and adjacent to sidewalls of the gate trenches, located in parallel and surrounding with the first doped column regions; split gate electrodes along the upper inner surface of each of the gate trenches and close to the second gate insulation layer, the split gate electrodes having bottoms interfaced with the first gate insulation layer and having sidewalls interfaced with the second gate insulation layer; a source electrode disposed between the split gate electrodes and extending deeper than the split gate electrodes in each of the gate trenches, the source electrode having a lower portion which is underneath the split gate electrodes and interfaced with the first gate insulation layer, and having an upper portion which is adjacent to the split gate electrodes and interfaced with the second gate insulation layer; a plurality of body regions of the second conductivity type formed in the mesas and adjacent to the split gate electrodes, covering a top surface of the first doped column regions and the second doped column regions between two adjacent gate trenches; multiple trenched source-body contacts in each of the mesas in an active area, each filled with a contact metal plug and extending into the body regions; and a plurality of source regions of the first conductivity type formed near top surface of the mesas in the active area and having a higher doping concentration than the epitaxial layer, the source regions located only near channel regions not between the multiple trenched source-body contacts.

Preferred embodiments include one or more of the following features: the gate trenches each having a trench bottom above the substrate and underneath a bottom surface of each of the first doped column regions and the second doped column regions; the gate trenches each having a trench bottom further extending into the substrate, and the first doped column regions and the second doped column regions each having a bottom surface reaching the substrate; the source electrode in each of the gate trenches being connected to a source metal through a trenched source electrode contact filled with the contact metal plug; the gate trenches further extending to a gate contact trench which has a same filling-in structure as the gate trenches, wherein the split gate electrodes in the gate contact trench are connected to a gate metal through a trenched gate contact filled with the contact metal plug; the contact metal plug is a tungsten metal layer padded by a barrier metal layer of Ti/TiN or Co/TiN or Ta/TiN; the contact metal plug is Al alloys or Cu padded by a barrier metal layer of Ti/TiN or Co/TiN or Ta/TiN, wherein the contact metal plug is also extended onto a contact interlayer to respectively formed as a source metal or a gate metal; the present invention further comprising a plurality of body contact doped regions of the second conductivity type within the body regions and surrounding at least bottoms of the multiple trenched source-body contacts underneath the source regions, wherein the body contact doped regions have a higher doping concentration than the body regions; the present invention further comprising a termination area which comprises a guard ring connected to the source regions and multiple floating guard rings having floating voltage, wherein the guard ring and the multiple floating guard rings have junction depths greater than the body regions; the present invention further comprising a termination area which comprises multiple floating trenched gates having floating voltage and being spaced apart by mesas comprising the body regions, wherein the floating trenched gates each having a filling-in structure the same as in the gate trenches; the present invention further comprising a termination area which comprises multiple floating trenched gates having floating voltage and being spaced apart by mesas without comprising the body regions, wherein the floating trenched gates each having a filling-in structure the same as in the gate trenches; the present invention further comprises multiple trenched body contact to connect into the body regions adjacent the active area to the source metal; the source regions have a uniform doping concentration and junction depth between sidewalls of the trenched source-body contacts to adjacent channel regions near the gate trenches; the source regions have a higher doping concentration and a greater junction depth along sidewalls of the trenched source-body contacts than along adjacent channel regions near the gate trenches, and the source regions have a Gaussian-distribution doping profile from the sidewalls of the trenched source-body contacts to the adjacent channel regions; the first conductivity type is N type and the second conductivity type is P type; the first conductivity type is P type and the second conductivity type is N type.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
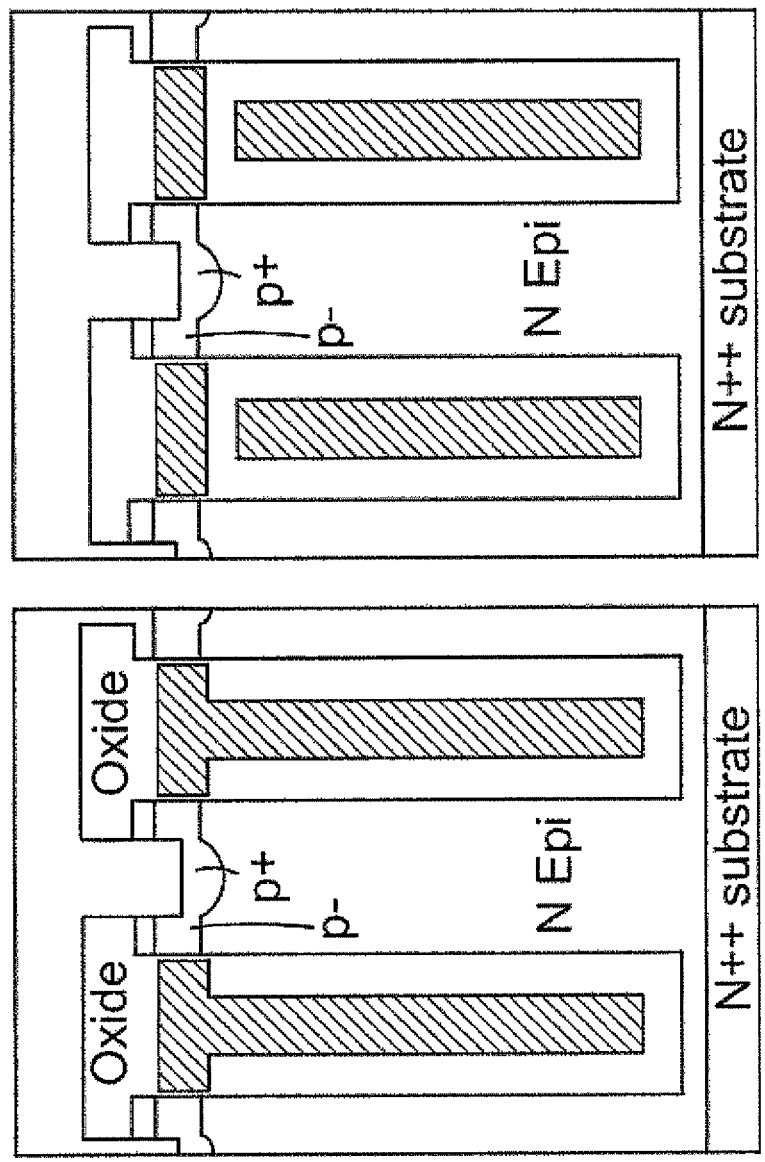
FIG. 1A is a cross-sectional view of a trench MOSFET of a prior art.
Figure 1B:
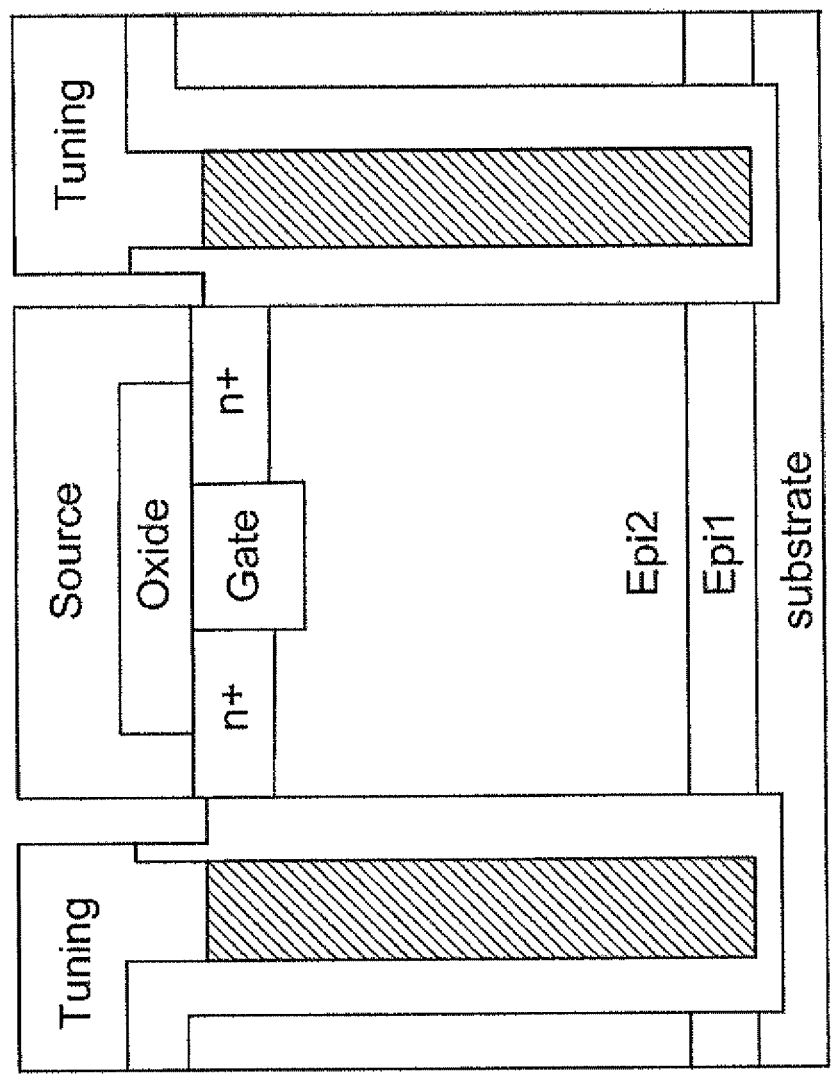
FIG. 1B is a cross-sectional view of a trench MOSFET of another prior art.
Figure 1C:
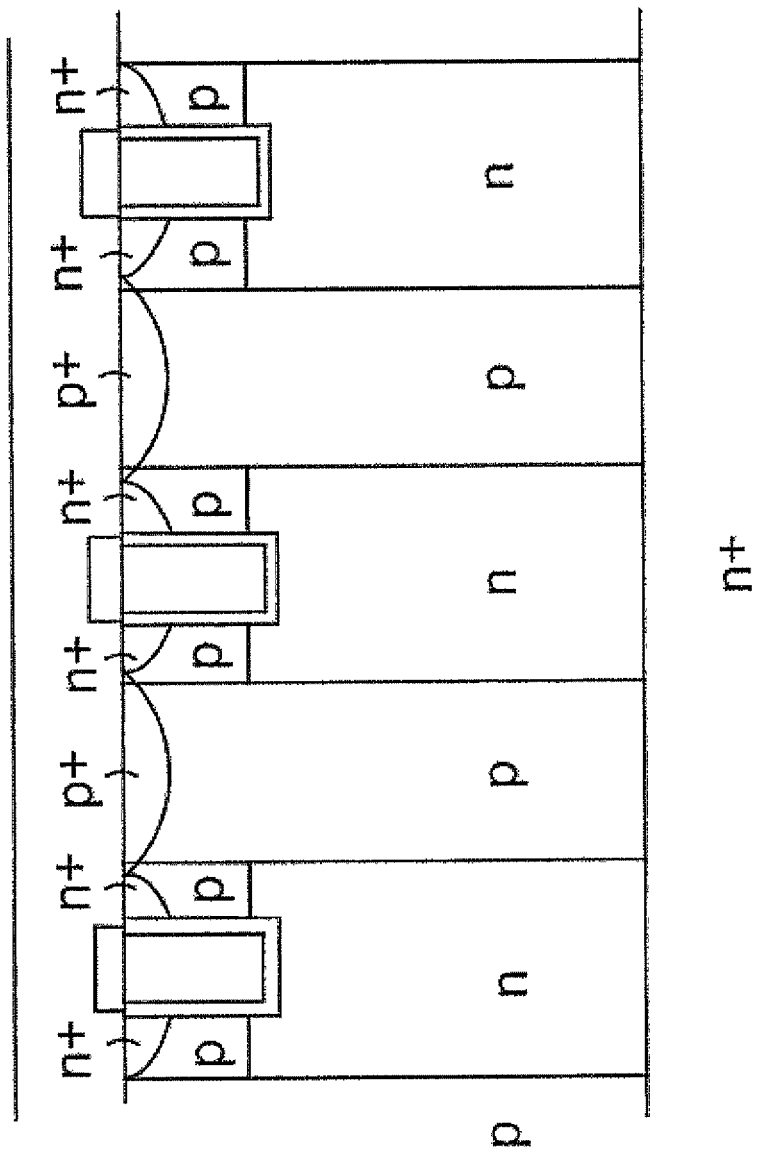
FIG. 1C is a cross-sectional view of a super-junction trench MOSFET of another prior art.
Figure 2A:
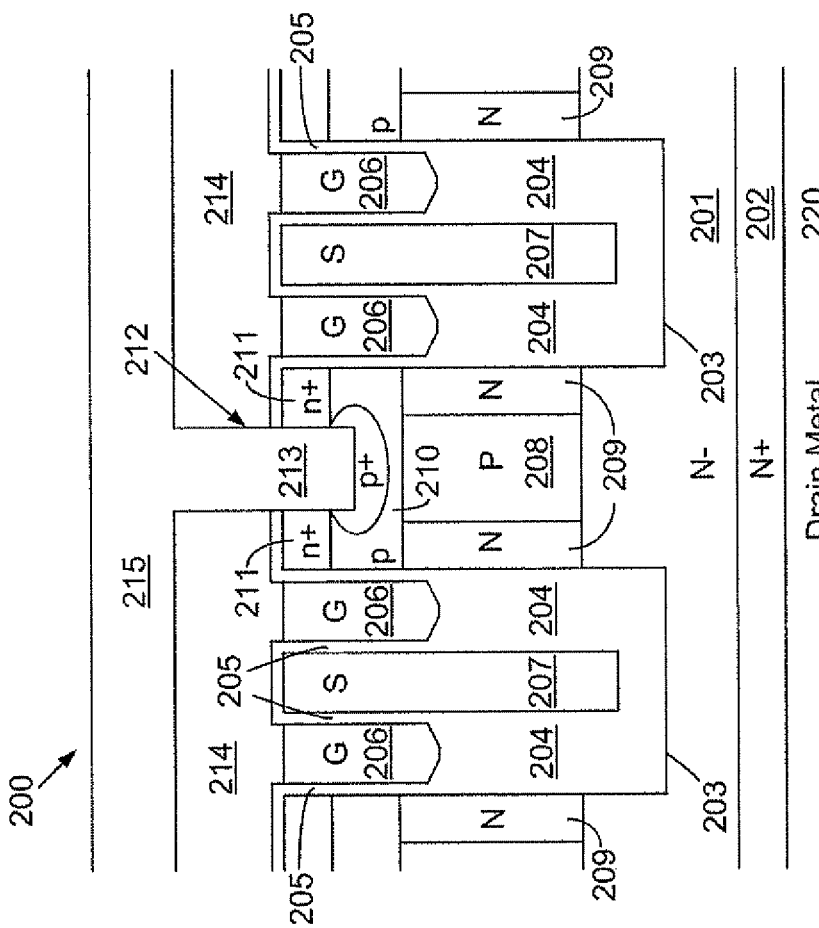
FIG. 2A is a cross-sectional view of a preferred embodiment according to the present invention.

Please refer to FIG. 2A for a preferred embodiment of this invention where an N-channel super-junction trench MOSFET 200 is formed in an N− epitaxial layer 201 onto an N+ substrate 202 coated with a back metal of Ti/Ni/Ag on a rear side as a drain metal 220. A plurality of gate trenches 203 are formed starting from a top surface of the N− epitaxial layer 201 and extending downward into the N− epitaxial layer 201, wherein trench bottoms of the gate trenches 203 are above a common interface between the N+ substrate 202 and the N− epitaxial layer 201. Each of the gate trenches 203 is lined by a first gate insulation layer 204 along a lower inner surface and lined by a second gate insulation layer 205 along an upper inner surface, wherein the first gate insulation layer 204 has a greater thickness than the second gate insulation layer 205. Split gate electrodes 206 (G, as illustrated) are formed along the upper inner surface of each of the gate trenches 203, having sidewalls surrounded by the second gate insulation layer 205 and having a bottom interfaced with the first gate insulation layer 204. A source electrode 207 (S, as illustrated) is formed between the split gate electrodes 206 within each of the gate trenches 203, the source electrode 207 has a lower portion underneath the split gate electrodes 206 and surrounded by the first gate insulation layer 204, the source electrode 207 has an upper portion adjacent to the split gate electrodes 206 and surrounded by the second gate insulation layer 205, wherein the split gate electrodes 206 each is formed in the middle between the source electrode 207 and the upper inner surface of each of the gate trenches 203. Both the split gate electrode 206 and the source electrode 207 can be implemented by using doped poly-silicon layer. A plurality of mesas are located between two adjacent gate trenches 203. A P type first doped column region 208 is formed in each of the mesas and a pair of N type second doped column regions 209 are formed adjacent to sidewalls of the gate trenches 203 and surround in parallel with the P type second doped column region 208. Onto a top surface of the N type second doped column regions 209 and the P type first doped column regions 208 in the mesas, p body regions 210 are formed covered by n+ source regions 211 in an active area and adjacent to the split gate electrodes 206. A trenched source-body contacts 212 filled with a contact metal plug 213 are penetrating through a contact interlayer 214, the n+ source regions 211 in the active area and extending into the p body region 210, wherein the contact metal plug 213 is Al alloys or Cu padded by a barrier metal layer of Ti/TiN or Co/TiN or Ta/TiN, the contact metal plug 213 is also extended onto the contact interlayer 214 to be formed as a source metal 215 which is connected to the n+ source regions 211 and the p body region 210. The n+ source regions 211 have a uniform doping concentration and junction depth between sidewalls of the trenched source-body contacts 212 to adjacent channel regions near the gate trenches 203. A p+ body contact doped region 216 is formed surrounding at least bottom of the trenched source-body contact 212 to reduce the contact resistance between the p body regions 210 and the contact metal plug 213.

Figure 2B:
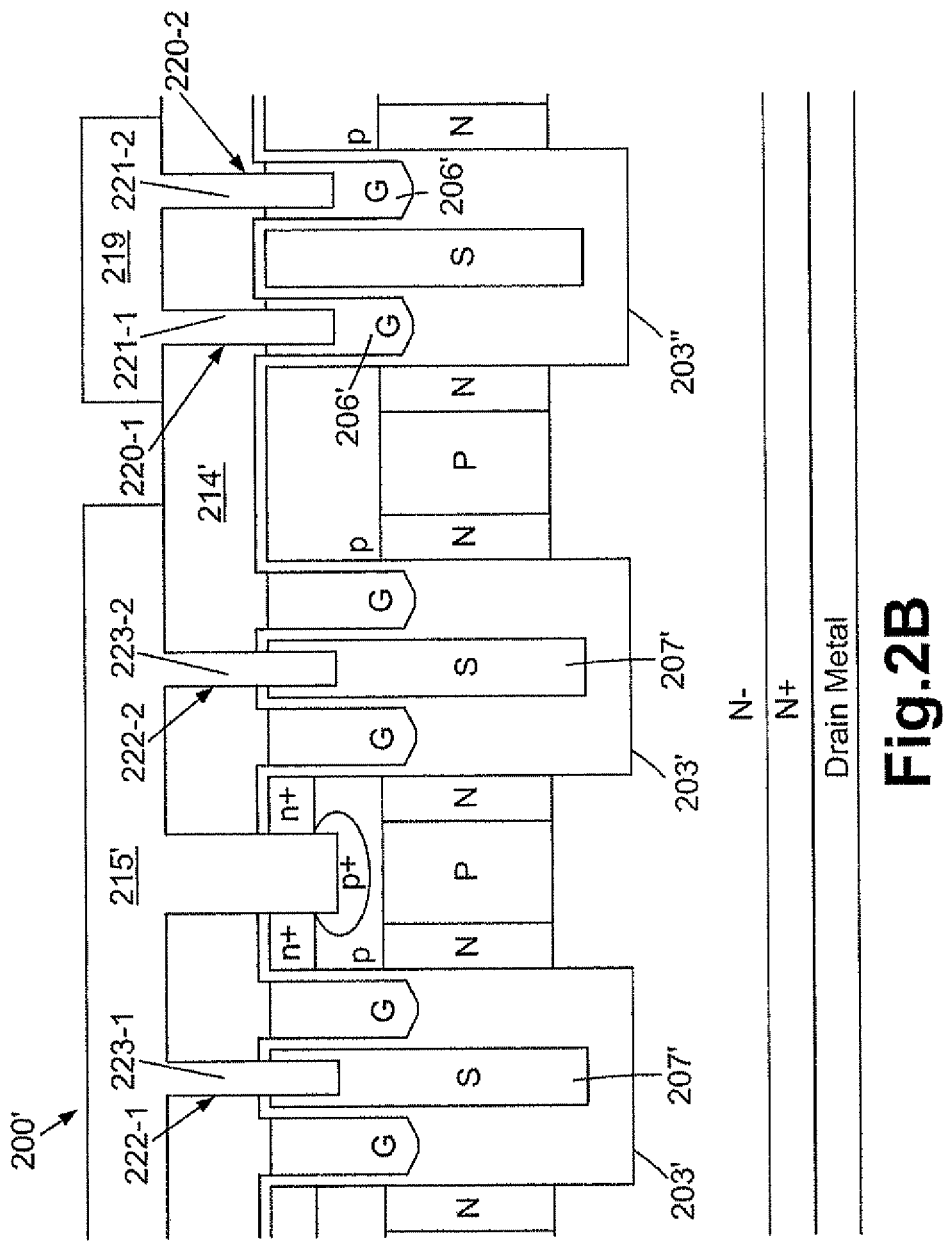
FIG. 2B is another cross-sectional view of the preferred embodiment according to the present invention.

FIG. 2B shows a cross-sectional view of another trench MOSFET 200' according to the present invention. The N-channel super-junction trench MOSFET 200' has a similar structure to the trench MOSFET 200 in FIG. 2A, except that, the source electrode 207' in each of the gate trenches 203' is connected to the source metal 215' through a trenched source electrode contact (222-1 or 222-2) filled with the contact metal plug (223-1 or 223-2, which is the same as the contact metal plug 213 in FIG. 2A). Moreover, the gate trenches 203' further extend to a gate contact trench 203" which has a same filling-in structure as in the gate trenches 203'. The split gate electrode 206' within the gate contact trench 203" are connected to a gate metal 219 via a trenched gate contact (220-1 or 220-2) filled with the contact metal plug (221-1 or 221-2, which is the same as the contact metal plug 213) for gate connection. In this embodiment, the contact metal plugs 223-1 and 223-2 are extending over the contact interlayer 214' to be formed as the source metal 215', the contact metal plugs 221-1 and 221-2 are extending over the contact interlayer 214' to be formed as the gate metal 219.

Figure 3:
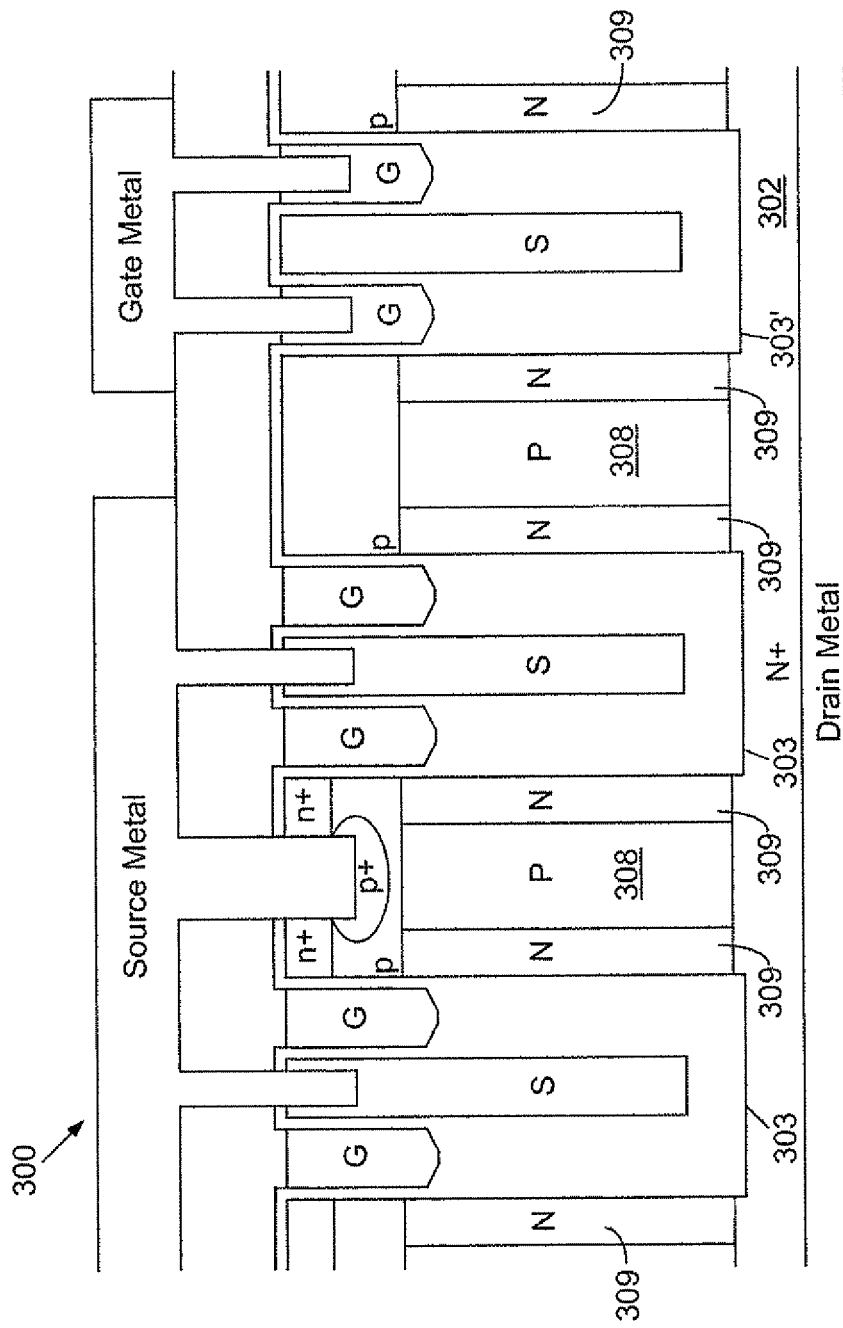
FIG. 3 is a cross-sectional view of another preferred embodiment according to the present invention.

FIG. 3 is a cross-sectional view of another preferred embodiment according to the present invention. N-channel super-junction trench MOSFET 300 in FIG. 3 is similar to the trench MOSFET 200' in FIG. 2B except that, in FIG. 3, the gate trenches 303 and the gate contact trench 303' are starting from the top surface of the epitaxial layer and further extending into the N+ substrate 302. Besides, bottoms of the N type second doped column regions 309 and the P type first doped column regions 308 are reaching the common interface between the epitaxial layer and the N+ substrate 302.

Figure 4:
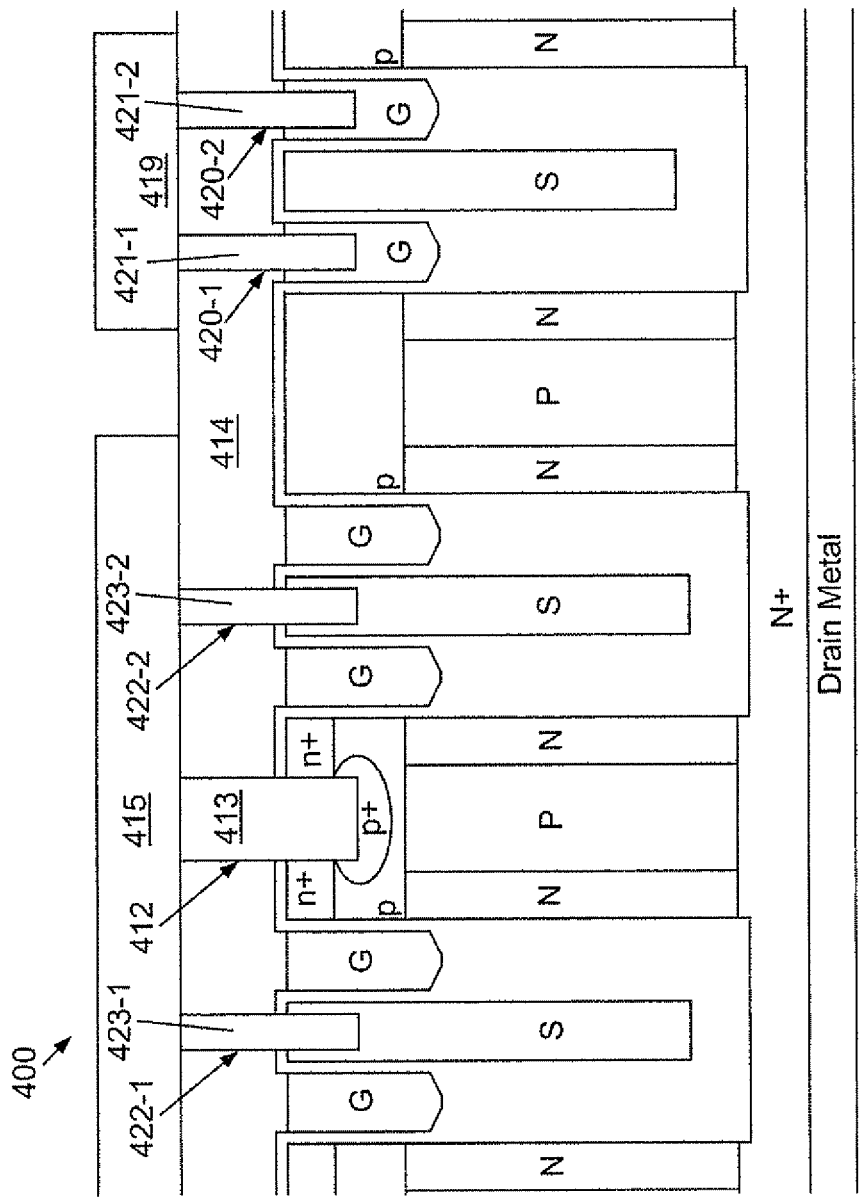
FIG. 4 is a cross-sectional view of another preferred embodiment according to the present invention.

FIG. 4 is a cross-sectional view of another preferred embodiment according to the present invention. N-channel super-junction trench MOSFET 400 in FIG. 4 is similar to the trench MOSFET 300 in FIG. 3 except that, in FIG. 4, the contact metal plugs (423-1 and 423-2) filled in the trenched source electrode contacts (422-1 and 422-2), the contact metal plug 413 filled in the trenched source-body contact 412, and the contact metal plugs (421-1 and 421-2) filled in the trenched gate contacts (420-1 and 420-2) are respectively a tungsten metal layer padded by a barrier metal layer of Ti/TiN or Co/TiN or Ta/TiN. Moreover, the source metal 415 and the gate metal 419 extending over the contact interlayer 414 are padded by a resistance-reduction layer underneath to reduce the contact resistance between the source metal 415 and the contact metal plugs (413, 423-1 and 423-2), between the gate metal 419 and the contact metal plugs (421-1 and 421-2).

Figure 5A:
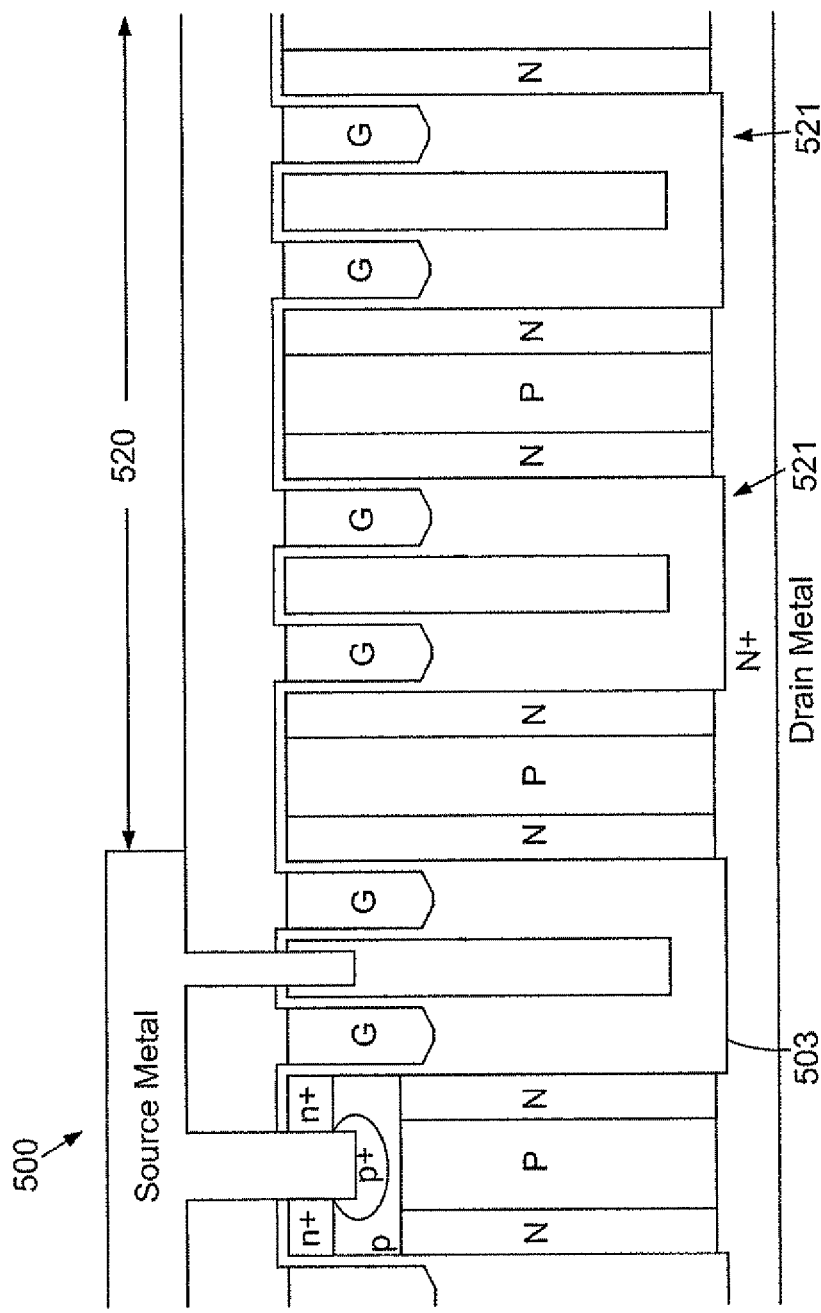
FIG. 5A is a cross-sectional view of another preferred embodiment according to the present invention.

FIG. 5A shows a cross-sectional view of another preferred embodiment according to the present invention which has a similar structure in the active area to the trench MOSFET 300 in FIG. 3, except that, the N-channel super-junction trench MOSFET 500 in FIG. 5A further comprises a termination area 520 comprising multiple floating trenched gates 521 being spaced apart by a plurality of mesas without having body regions between them in the termination area 520, wherein the multiple floating trenched gates 521 having a floating voltage have a same filling-in structure as in the gate trenches 503 in the active area.

Figure 5B:
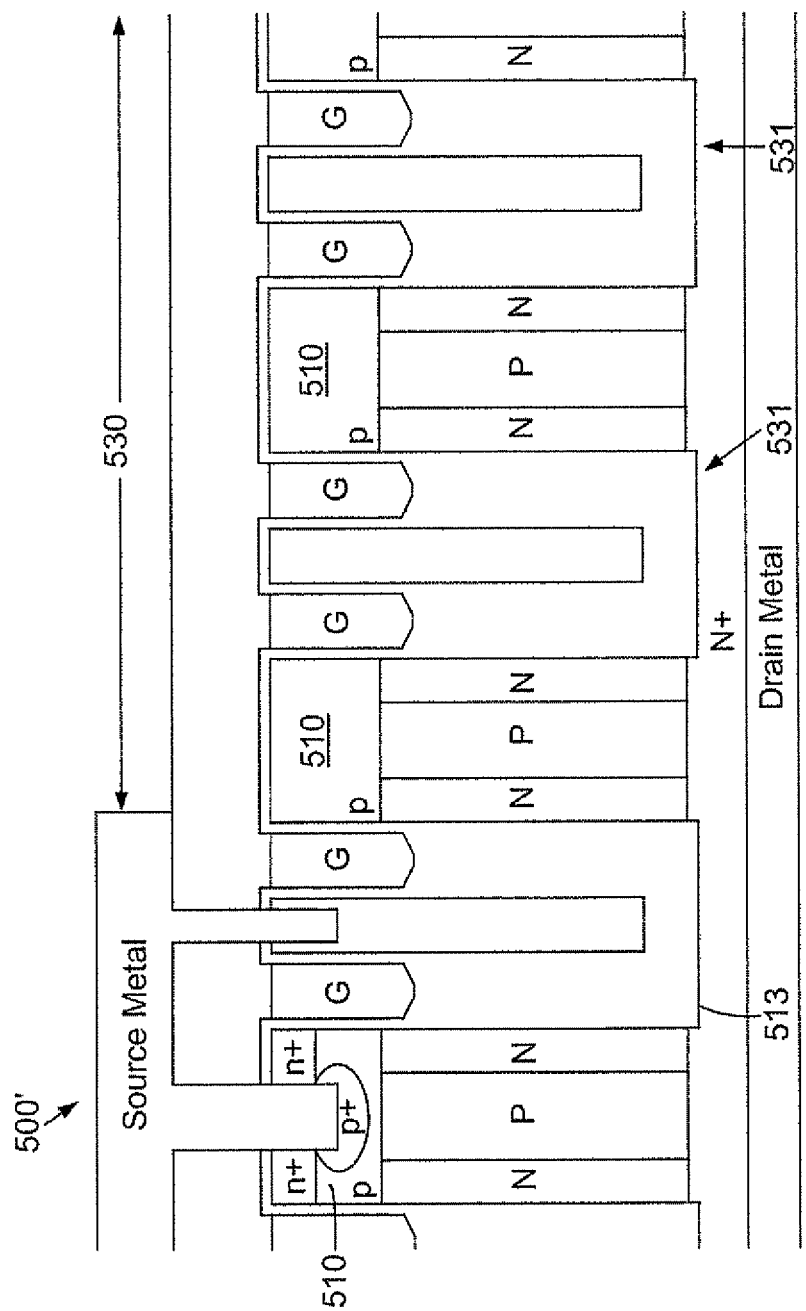
FIG. 5B is a cross-sectional view of another preferred embodiment according to the present invention.

FIG. 5B shows a cross-sectional view of another preferred embodiment according to the present invention which has a similar structure in the active area to the trench MOSFET 300 in FIG. 3, except that, the N-channel super-junction trench MOSFET 500' in FIG. 5B further comprises a termination area 530 comprising multiple floating trenched gates 531 being spaced apart by a plurality of mesas having the p body regions 510 in the termination area 530, wherein the trenched floating gates 531 having a floating voltage have a same filling-in structure as in the gate trenches 513 in the active area.

Figure 5C:
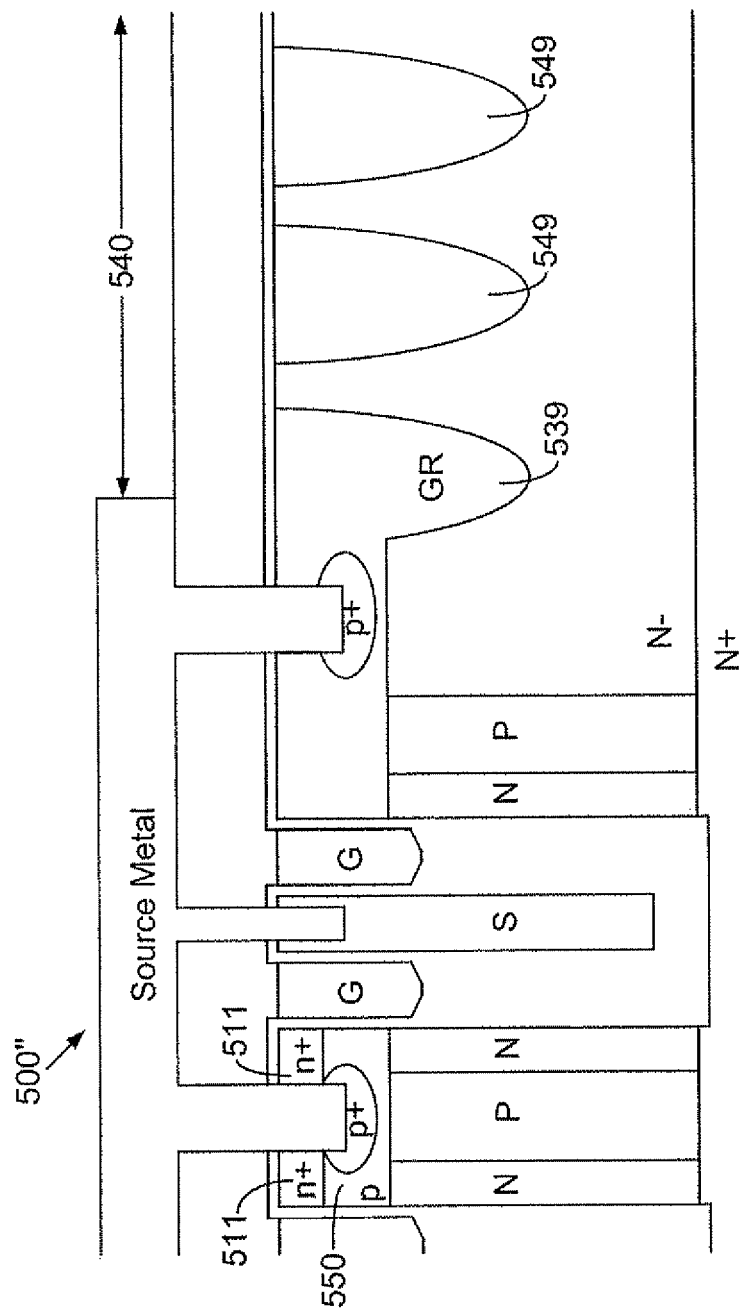
FIG. 5C is a cross-sectional view of another preferred embodiment according to the present invention.

FIG. 5C shows a cross-sectional view of another preferred embodiment according to the present invention which has a similar structure in the active area to the trench MOSFET 300 in FIG. 3, except that, the N-channel super-junction trench MOSFET 500" in FIG. 5C further comprises a guard ring 539 (GR, as illustrated in FIG. 5C) connected with the n+ source regions 511, and multiple floating guard rings 549 having floating voltage in a termination area 540, wherein the guard ring 539 and the multiple floating guard rings 549 have junction depths greater than the p body regions 550.

Figure 6:
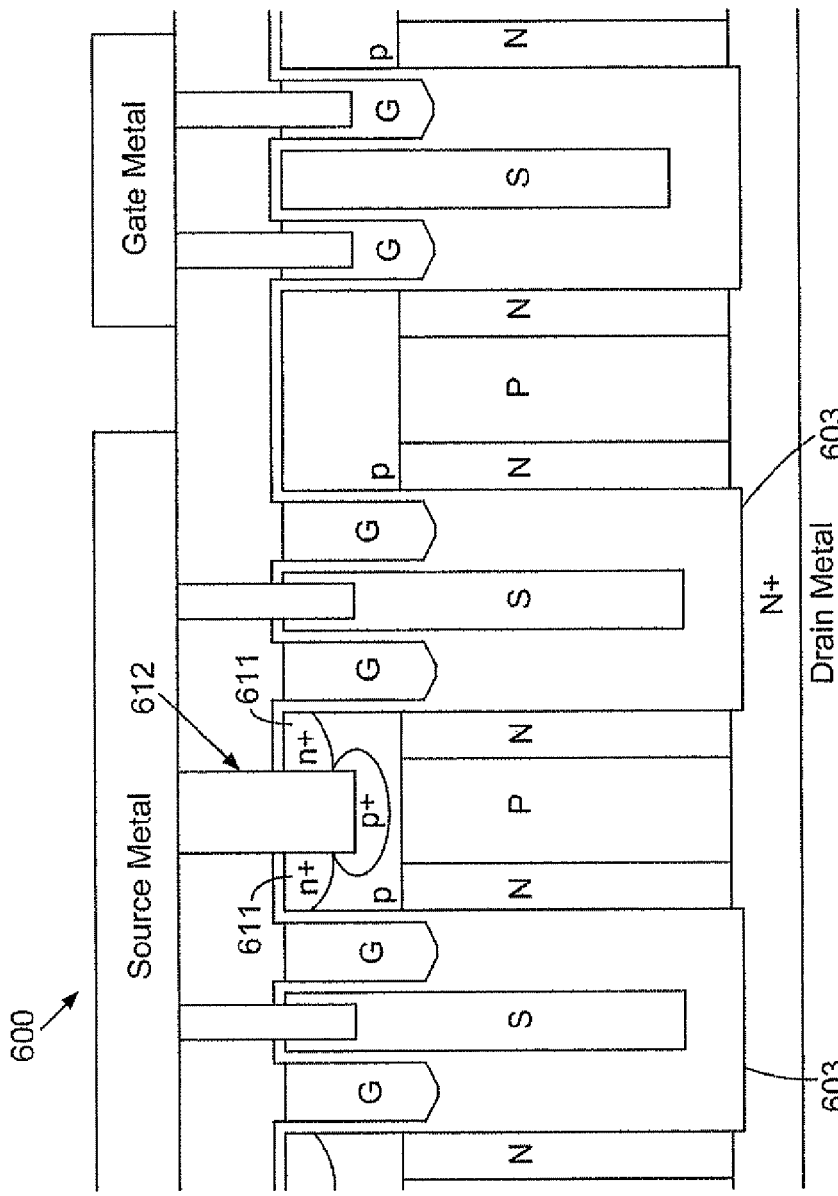
FIG. 6 is a cross-sectional view of another preferred embodiment according to the present invention.

FIG. 6 shows a cross-sectional view of another preferred embodiment according to the present invention which has a similar structure to the trench MOSFET 400 in FIG. 4 except that, in N-channel super-junction trench MOSFET 600 of FIG. 6, the n+ source regions 611 have a higher doping concentration and a greater junction depth along sidewalls of the trenched source-body contacts 612 than along adjacent channel regions near the gate trenches 603, and the n+ source regions 611 have a Gaussian-distribution doping profile from the sidewalls of the trenched source-body contacts 612 to the adjacent channel regions near the gate trenches 603.

Figure 7A:
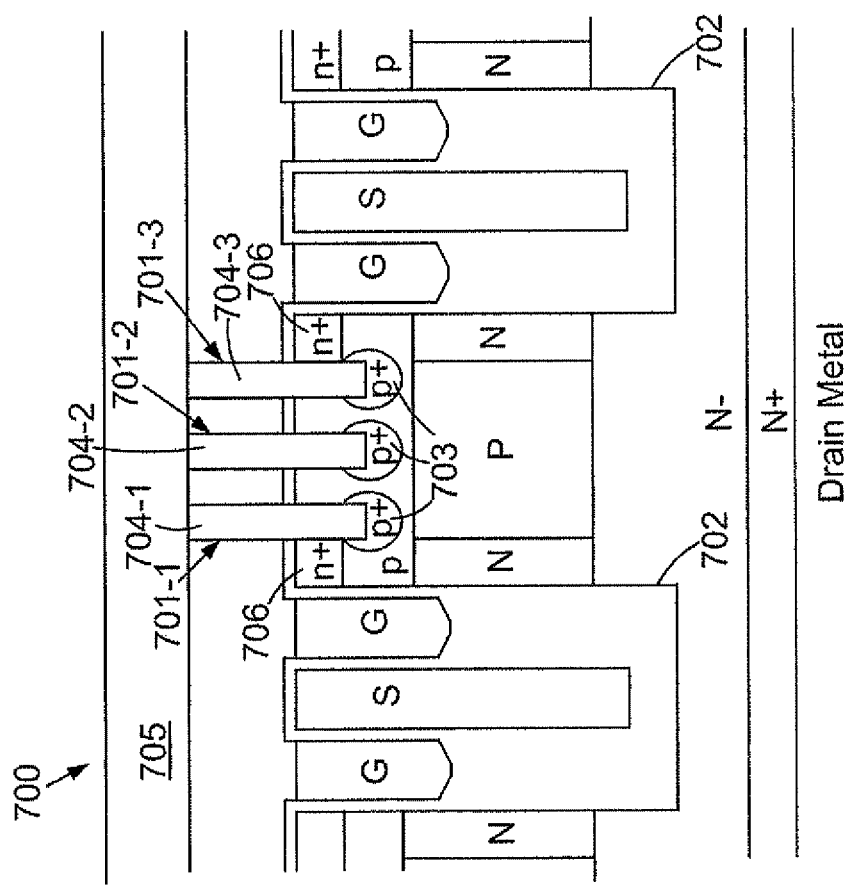
FIG. 7A is a cross-sectional view of another preferred embodiment according to the present invention.

FIG. 7A shows a cross-sectional view of another preferred embodiment according to the present invention which has a similar structure to the trench MOSFET 400 in FIG. 4 except that, the N-channel super-junction trench MOSFET 700 of FIG. 7A comprises multiple trenched source-body contacts (701-1, 701-2 and 701-3) extending into a mesa between every two adjacent of the gate trenches 702 in the active area. Meanwhile, each of the trenched source-body contacts (701-1 or 701-2 or 701-3) has a bottom surrounded by the p+ body contact doped region 703 and is filled with a contact metal plug (704-1 or 704-2 or 704-3) comprising the tungsten metal layer padded by a barrier metal layer of Ti/TiN or Co/TiN or Ta/TiN which is connected to the source metal 705. Specifically, the n+ source regions 706 in the active area are located only along channel regions near the gate trenches 702, not between adjacent trenched source-body contacts for UIS capability enhancement.

Figure 7B:
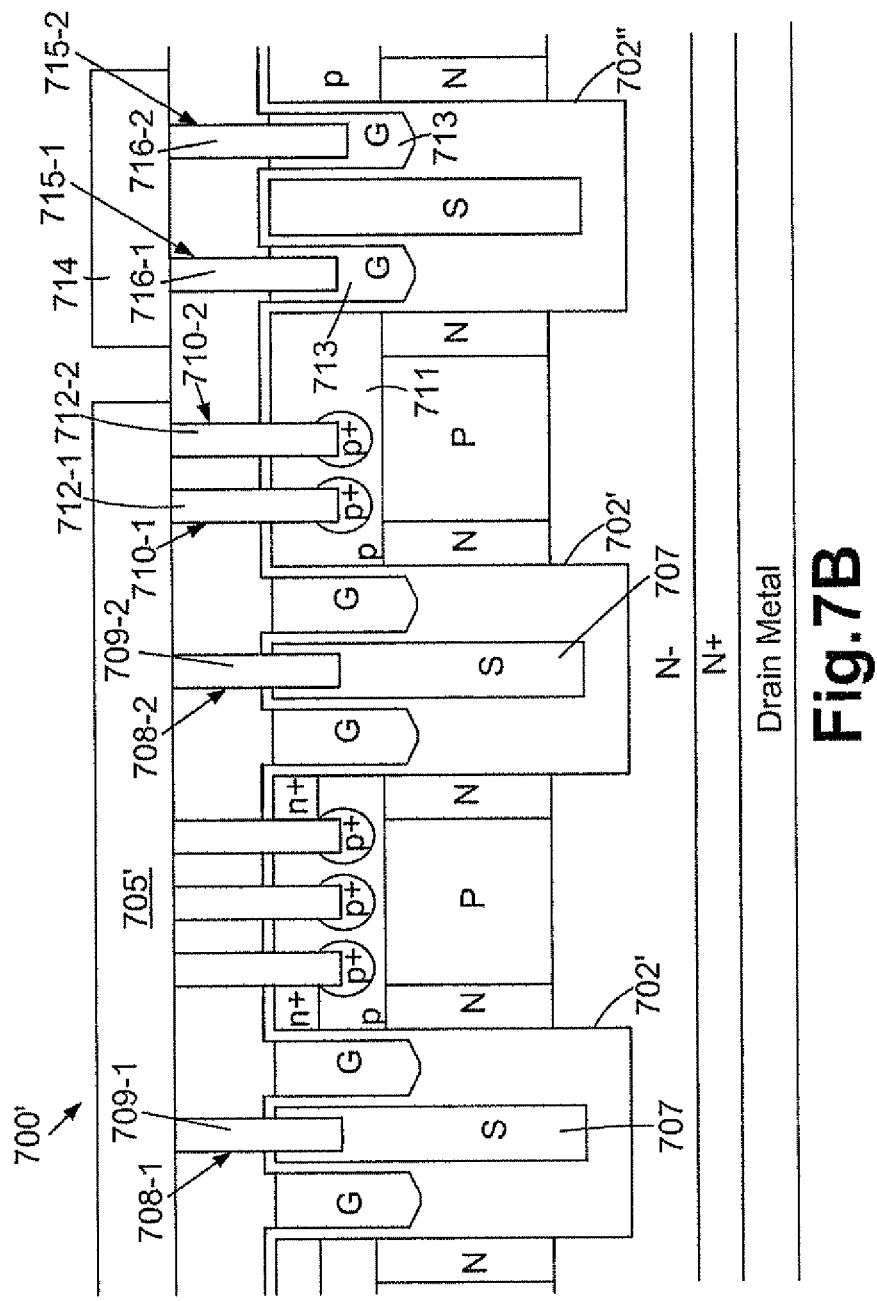
FIG. 7B is a cross-sectional view of another preferred embodiment according to the present invention.

FIG. 7B shows a cross-sectional view of another trench MOSFET 700' according to the present invention. The N-channel super-junction trench MOSFET 700' has a similar structure to the trench MOSFET 700 in FIG. 7A, except that, the source electrode 707 in each of the gate trenches 702' is connected to the source metal 705' through a trenched source electrode contact (708-1 or 708-2) filled with the contact metal plug (709-1 or 709-2, which is the same as the contact metal plug 704-2 in FIG. 7A). Meanwhile, the N-channel super-junction trench MOSFET 700' further comprises multiple trenched body contacts (710-1 or 710-2) extending into a mesa adjacent the active area, connecting the p body region 711 adjacent the active area to the source metal 705', wherein each of the trenched body contacts (710-1 or 710-2) is filled with a contact metal plug (712-1 or 712-2, the same as the contact metal plug 704-2 in FIG. 7A). Moreover, the gate trenches 702' further extend to a gate contact trench 702" which has a same filling-in structure as in the gate trenches 702'. The split gate electrode 713 within the gate contact trench 702" are connected to a gate metal 714 via a trenched gate contact (715-1 or 715-2) filled with the contact metal plug (716-1 or 716-2, which is the same as the contact metal plug 704-2 in FIG. 7A) for gate connection.

Figure 8:
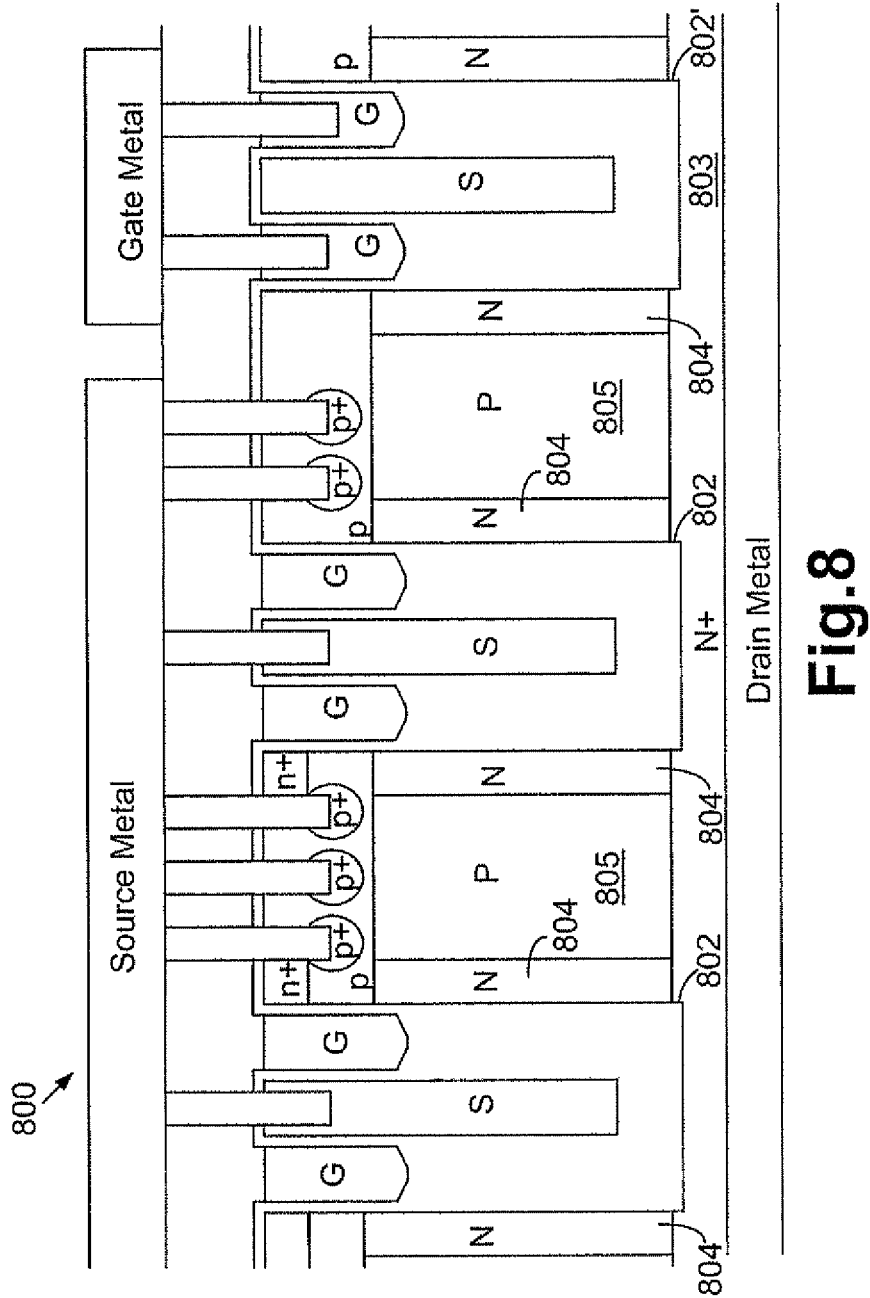
FIG. 8 is a cross-sectional view of another preferred embodiment according to the present invention.

FIG. 8 is a cross-sectional view of another preferred embodiment according to the present invention. N-channel super-junction trench MOSFET 800 in FIG. 8 is similar to the trench MOSFET 700' in FIG. 7B except that, in FIG. 8, the gate trenches 802 and the gate contact trench 802' are starting from the top surface of the epitaxial layer and further extending into the N+ substrate 803. Besides, bottoms of the N type second doped column regions 804 and the P type first doped column regions 805 are reaching the common interface between the epitaxial layer and the N+ substrate 803.

Figure 9A:
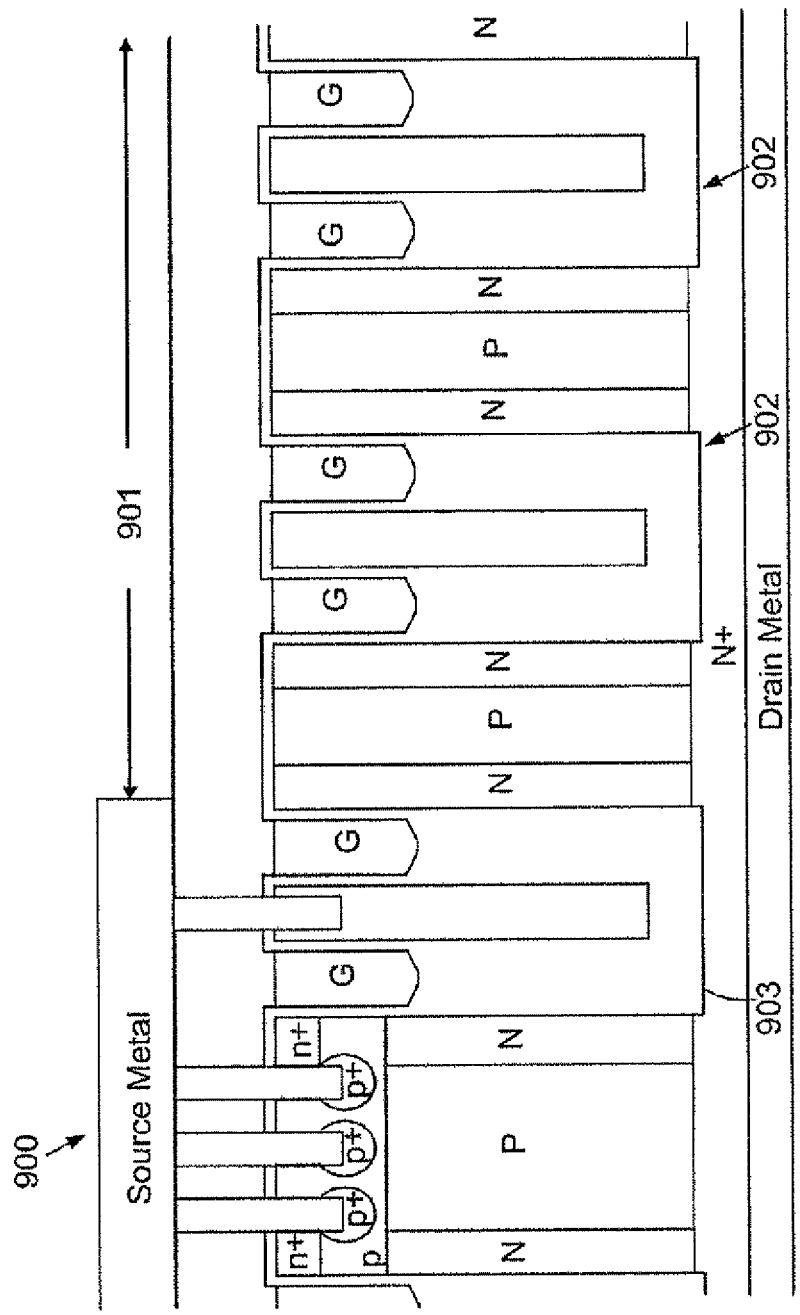
FIG. 9A is a cross-sectional view of another preferred embodiment according to the present invention.

FIG. 9A shows a cross-sectional view of another preferred embodiment according to the present invention which has a similar structure in the active area to the trench MOSFET 800 in FIG. 8, except that, the N-channel super-junction trench MOSFET 900 in FIG. 9A further comprises a termination area 901 comprising multiple floating trenched gates 902 being spaced apart by a plurality of mesas without having body regions between them in the termination area 901, wherein the multiple floating trenched gates 902 having a floating voltage have a same filling-in structure as in the gate trenches 903 in the active area.

Figure 9B:
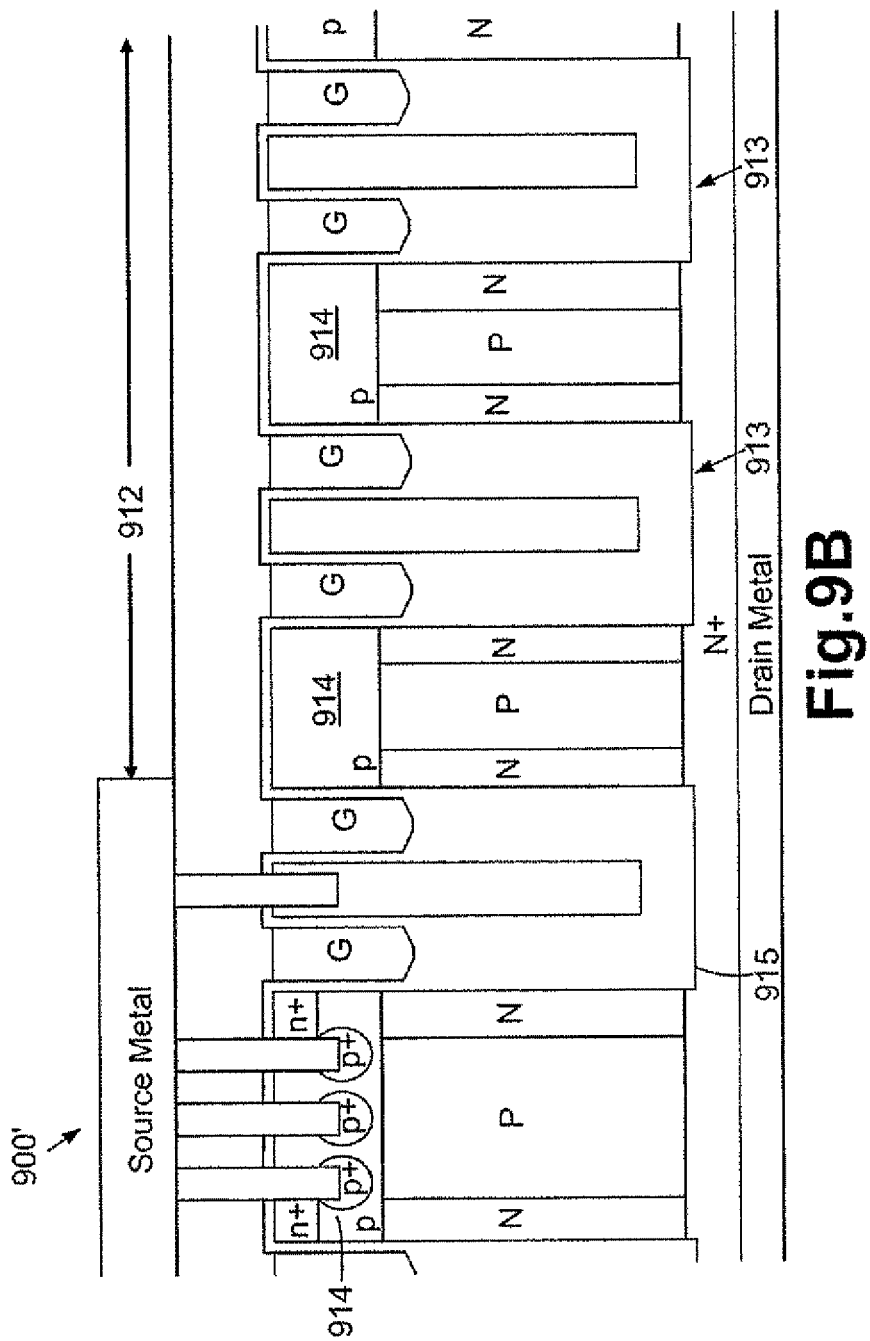
FIG. 9B is a cross-sectional view of another preferred embodiment according to the present invention.

FIG. 9B shows a cross-sectional view of another preferred embodiment according to the present invention which has a similar structure in the active area to the trench MOSFET 800 in FIG. 8, except that, the N-channel super-junction trench MOSFET 900' in FIG. 9B further comprises a termination area 912 comprising multiple floating trenched gates 913 being spaced apart by a plurality of mesas having the p body regions 914 in the termination area 912, wherein the trenched floating gates 913 having a floating voltage have a same filling-in structure as in the gate trenches 915 in the active area.

Figure 9C:
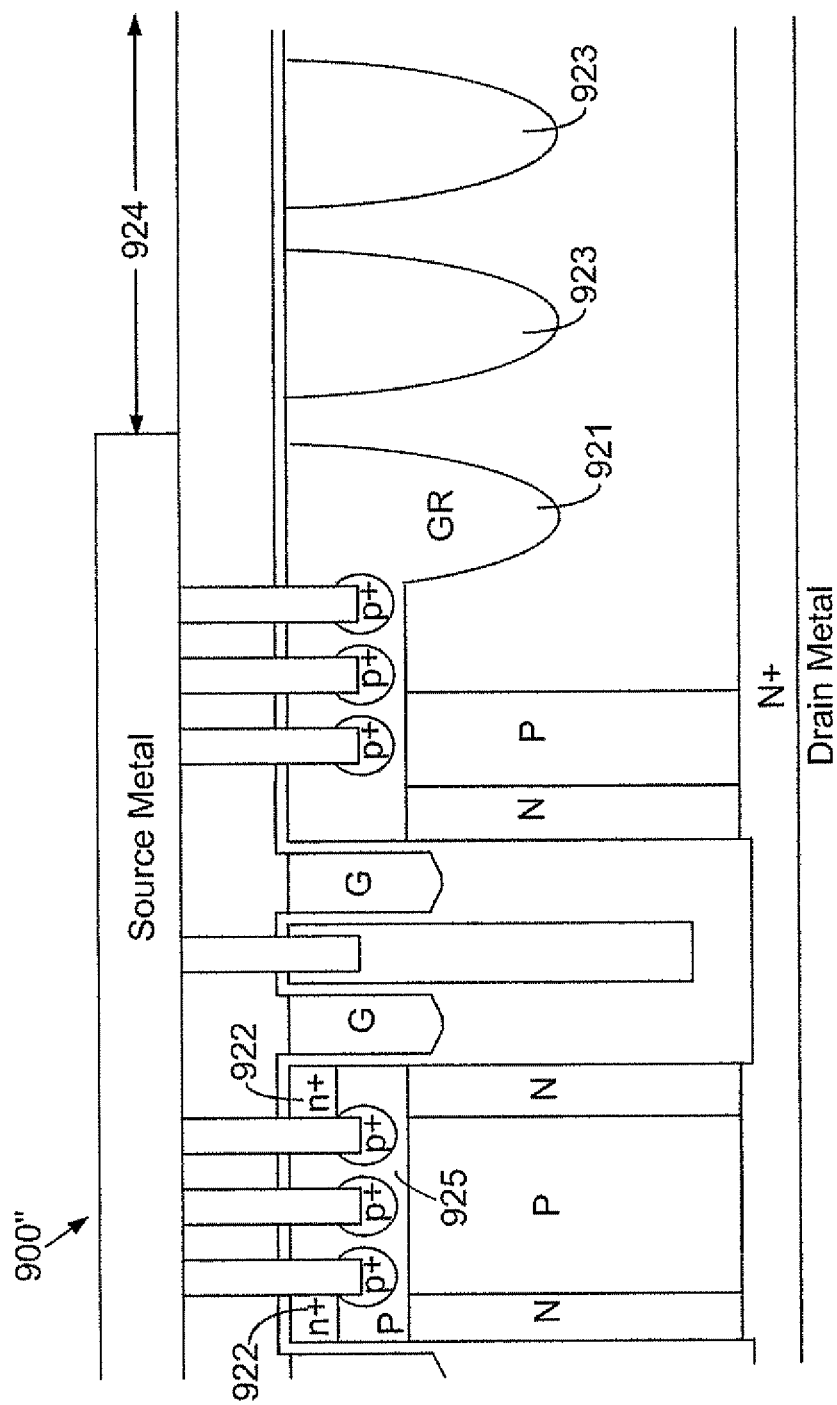
FIG. 9C is a cross-sectional view of another preferred embodiment according to the present invention.

FIG. 9C shows a cross-sectional view of another preferred embodiment according to the present invention which has a similar structure in the active area to the trench MOSFET 800 in FIG. 8, except that, the N-channel super-junction trench MOSFET 900" in FIG. 9C further comprises a guard ring 921 (GR, as illustrated in FIG. 9C) connected with the n+ source regions 922, and multiple floating guard rings 923 having floating voltage in a termination area 924, wherein the guard ring 921 and the multiple floating guard rings 923 have junction depths greater than the p body regions 925.

Figure 10:
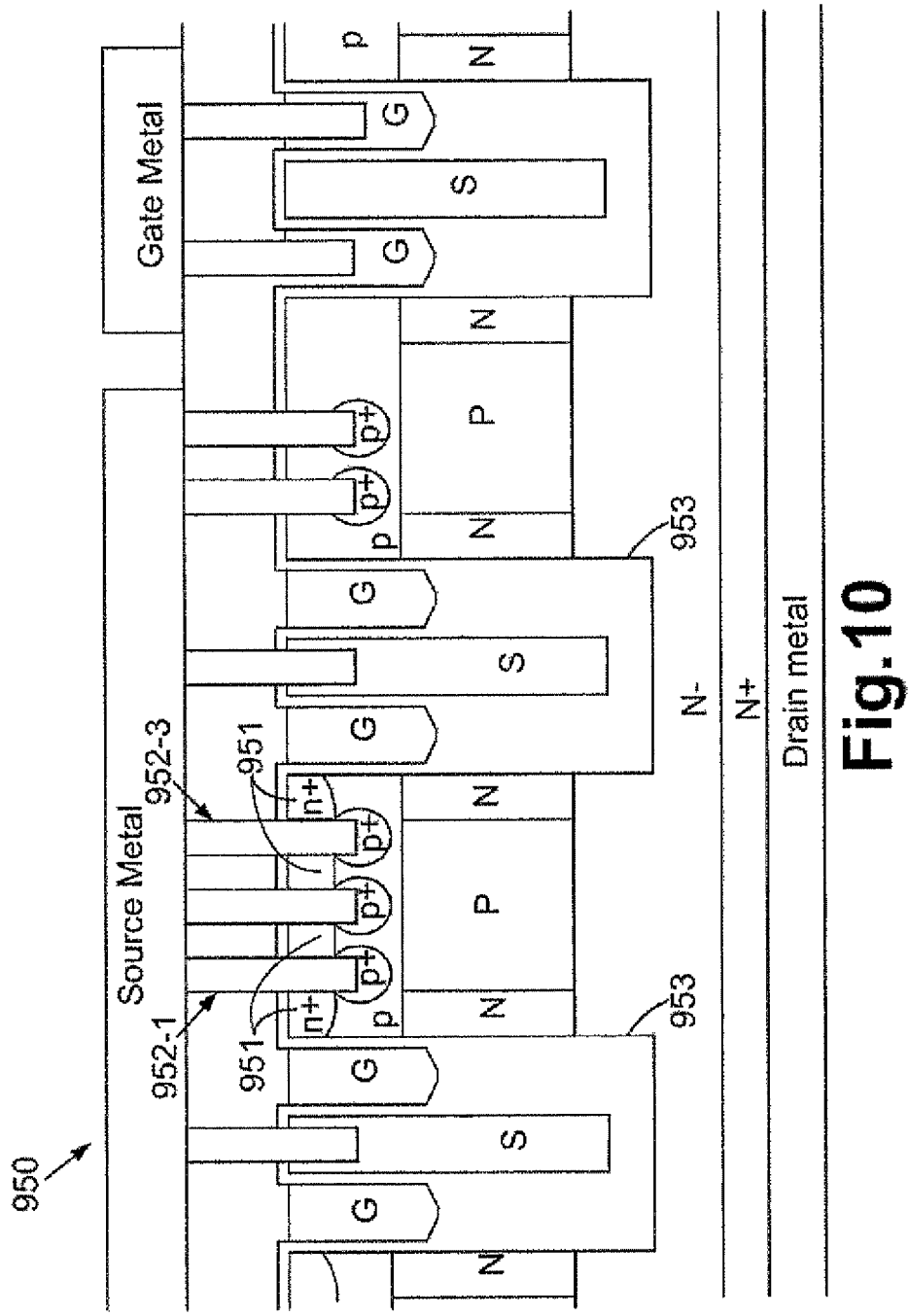
FIG. 10 is a cross-sectional view of another preferred embodiment according to the present invention.

FIG. 10 shows a cross-sectional view of another preferred embodiment according to the present invention which has a similar structure to the trench MOSFET 700' in FIG. 7B except that, in N-channel super-junction trench MOSFET 950 of FIG. 10, the n+ source regions 951 have a higher doping concentration and a greater junction depth along sidewalls of the trenched source-body contacts (952-1 or 952-3)

than along adjacent channel regions near the gate trenches 953, and the n+ source regions 951 have a Gaussian-distribution doping profile from the sidewalls of the trenched source-body contacts (952-1 or 952-3) to the adjacent channel regions near the gate trenches 953. The n+ source regions 951 are also disposed between adjacent the trenched source-body contacts with uniform doping concentration.

Figure 11:
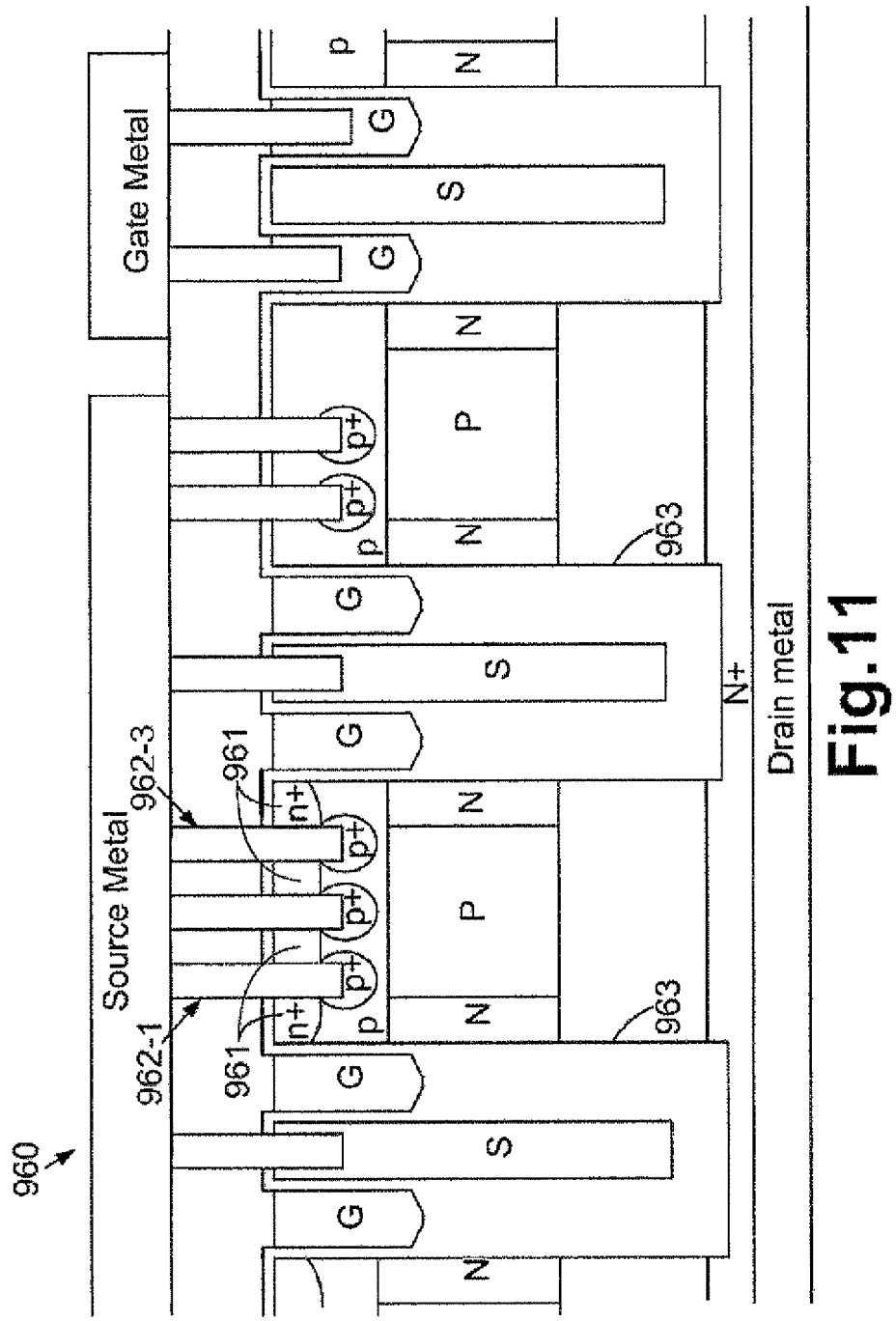
FIG. 11 is a cross-sectional view of another preferred embodiment according to the present invention.

FIG. 11 shows a cross-sectional view of another preferred embodiment according to the present invention which has a similar structure to the trench MOSFET 800 in FIG. 8 except that, in N-channel super-junction trench MOSFET 960 of FIG. 11, the n+ source regions 961 have a higher doping concentration and a greater junction depth along sidewalls of the trenched source-body contacts (962-1 or 962-3) than along adjacent channel regions near the gate trenches 963, and the n+ source regions 961 have a Gaussian-distribution doping profile from the sidewalls of the trenched source-body contacts (962-1 or 962-3) to the adjacent channel regions near the gate trenches 963. The n+ source regions 961 are also disposed between adjacent the trenched source-body contacts with uniform doping concentration across sidewalls of the trenched source-body contacts.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A super-junction trench MOSFET comprising:
   a substrate of a first conductivity type;
   an epitaxial layer of the first conductivity type onto said substrate, wherein said epitaxial layer has a lower doping concentration than said substrate;
   a plurality of gate trenches starting from a top surface of said epitaxial layer and extending downward into said epitaxial layer, each of said gate trenches being padded by a first gate insulation layer along a lower inner surface and padded by a second gate insulation layer along an upper inner surface, wherein said first gate insulation layer has a greater thickness than said second gate insulation layer;
   a plurality of mesas between two adjacent gate trenches;
   a plurality of first doped column regions of a second conductivity type formed in said mesas;
   a plurality of second doped column regions of the first conductivity type formed in said mesas and adjacent to sidewalls of said gate trenches, located in parallel and surrounding with said first doped column regions;
   split gate electrodes along said upper inner surface of each of said gate trenches and close to said second gate insulation layer, said split gate electrodes having bottoms interfaced with said first gate insulation layer and having sidewalls interfaced with said second gate insulation layer;
   a source electrode disposed between said split gate electrodes and extending deeper than said split gate electrodes in each of said gate trenches, said source electrode having a lower portion which is underneath said split gate electrodes and interfaced with said first gate insulation layer, and having an upper portion which is adjacent to said split gate electrodes and interfaced with said second gate insulation layer;
   a plurality of body regions of the second conductivity type formed in said mesas and adjacent to said split gate electrodes, covering a top surface of said first doped column regions and said second doped column regions between two adjacent gate trenches;
   multiple trenched source-body contacts in each of said mesas in an active area, each filled with a contact metal plug and extending into said body regions; and
   a plurality of source regions of said first conductivity type at least formed along channel regions near top surface of said mesas in said active area.

2. The super-junction trench MOSFET of claim 1, wherein trench bottoms of said gate trenches are above a common interface between said substrate and said epitaxial layer.

3. The super-junction trench MOSFET of claim 1, wherein said gate trenches further extends into said substrate, and said first doped column regions and said second doped column regions have bottoms surfaces reaching a common interface between said substrate and said epitaxial layer.

4. The super-junction trench MOSFET of claim 1 further comprising a plurality of body contact doped regions of the second conductivity type within said body regions and surrounding at least bottoms of said multiple trenched source-body contacts, wherein said body contact doped regions have a higher doping concentration than said body regions.

5. The super-junction trench MOSFET of claim 1 further comprising a guard ring connected with said source regions, and multiple floating guard rings having floating voltage in a termination area, wherein said guard ring and said multiple floating guard rings have junction depths greater than said body regions.

6. The super-junction trench MOSFET of claim 1 further comprising multiple floating trenched gates having floating voltage in a termination area and being spaced apart by mesas having said body regions, said first doped columns and said second doped columns, wherein said floating trenched gates each having said source electrode and said split gate electrodes in said gate trenches.

7. The super-junction trench MOSFET of claim 1 further comprising multiple floating trenched gates having floating voltage in a termination area and being spaced apart by mesas comprising said first doped columns and said second doped columns without having said body regions, wherein said floating trenched gates each having said source electrode and said split gate electrodes in said gate trenches.

8. The super-junction trench MOSFET of claim 1, wherein said contact metal plug is a tungsten metal layer padded by a barrier metal layer of Ti/TiN or Co/TiN or Ta/TiN.

9. The super-junction trench MOSFET of claim 1, wherein said contact metal plug is Al alloys or Cu padded by a barrier metal layer of Ti/TiN or Co/TiN or Ta/TiN, wherein the contact metal plug is also extended onto a contact interlayer to respectively formed as a source metal or a gate metal.

10. The super-junction trench MOSFET of claim 1, wherein said source regions have a uniform doping concentration and junction depth between sidewalls of said trenched source-body contacts to adjacent channel regions near said gate trenches, and said source regions are only formed along channel regions but not between adjacent said multiple trenched source-body contacts.

11. The super-junction trench MOSFET of claim 1, wherein said source regions have a higher doping concentration and a greater junction depth along sidewalls of said trenched source-body contacts than along adjacent channel regions near said gate trenches, and said source regions are further formed with uniform doping concentration between adjacent said multiple trenched source-body contacts.

12. The super-junction trench MOSFET of claim 1 further comprising at least a trenched source electrode contact filled with a contact metal plug connects said source electrode with a source metal.

13. The super-junction trench MOSFET of claim 1 further comprising at least a gate contact trench filling with said source electrode and said split gate electrodes for gate connection, wherein said split gate electrodes having at least a trenched gate contact filled with a contact metal plug and connects to a gate metal.

14. The super-junction trench MOSFET of claim 1 further comprising multiple trenched body contacts filled with said contact metal plugs and extending into said body regions adjacent said active area.

* * * * *